(12) United States Patent
Dang et al.

(10) Patent No.: US 10,103,450 B2
(45) Date of Patent: *Oct. 16, 2018

(54) INTEGRATION OF AREA EFFICIENT ANTENNAS FOR PHASED ARRAY OR WAFER SCALE ARRAY ANTENNA APPLICATIONS

(71) Applicant: International Business Machines Corporation, Armonk, NY (US)

(72) Inventors: Bing Dang, Chappaqua, NY (US); Duixian Liu, Scarsdale, NY (US); Jean-Olivier Plouchart, New York, NY (US); Peter Jerome Sorce, Poughkeepsie, NY (US); Cornelia Kang-I Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 128 days.

This patent is subject to a terminal disclaimer.

(21) Appl. No.: 15/233,628

(22) Filed: Aug. 10, 2016

(65) Prior Publication Data
US 2016/0352023 A1 Dec. 1, 2016

Related U.S. Application Data

(62) Division of application No. 14/281,951, filed on May 20, 2014, now Pat. No. 9,472,859.

(51) Int. Cl.
*H01Q 21/00* (2006.01)
*H01Q 21/06* (2006.01)
(Continued)

(52) U.S. Cl.
CPC ......... *H01Q 21/065* (2013.01); *H01Q 1/2208* (2013.01); *H01Q 1/2283* (2013.01);
(Continued)

(58) Field of Classification Search
CPC ......... H01Q 21/061; H01Q 3/26; H01Q 1/246
(Continued)

(56) References Cited

U.S. PATENT DOCUMENTS

| 6,268,796 B1 | 7/2001 | Gnadinger et al. |
| 6,424,315 B1 | 7/2002 | Glenn et al. |

(Continued)

FOREIGN PATENT DOCUMENTS

JP     2006186586 A     7/2006

OTHER PUBLICATIONS

J.M. Edwards et al., "High-Efficiency Elliptical Slot Antennas With Quartz Superstrates for Silicon RFICs," Proceedings of the 2011 IEEE International Symposium on Antennas and Propagation, Jul. 2011, pp. 2055-2058.

(Continued)

*Primary Examiner* — Dameon E Levi
*Assistant Examiner* — Collin Dawkins
(74) *Attorney, Agent, or Firm* — Vazken Alexanian; Ryan, Mason & Lewis, LLP

(57) ABSTRACT

Package structures are provided for integrally packaging antennas with semiconductor RFIC (radio frequency integrated circuit) chips to form compact integrated radio/wireless communications systems that operate in the millimeter-wave and terahertz frequency ranges. For example, a package structure includes an RFIC chip, and an antenna package bonded to the RFIC chip. The antenna package includes a glass substrate, at least one planar antenna element formed on a first surface of the glass substrate, a ground plane formed on a second surface of the glass substrate, opposite the first surface, and an antenna feed line formed through the glass substrate and connected to the at (Continued)

least one planar antenna element. The antenna package is bonded to a surface of the RFIC chip using a layer of adhesive material.

20 Claims, 5 Drawing Sheets

(51) Int. Cl.
*H01Q 1/22* (2006.01)
*H01Q 1/48* (2006.01)

(52) U.S. Cl.
CPC ............ *H01Q 1/48* (2013.01); *H01Q 21/0075* (2013.01); *H01L 2224/16225* (2013.01)

(58) Field of Classification Search
USPC ................................. 343/893, 873, 878, 879
See application file for complete search history.

(56) References Cited

U.S. PATENT DOCUMENTS

| | | |
|---|---|---|
| 6,809,688 B2 | 10/2004 | Yamada |
| 7,728,774 B2 | 6/2010 | Akkermans et al. |
| 7,760,144 B2 | 7/2010 | Chang et al. |
| 8,232,920 B2 | 7/2012 | Ding et al. |
| 8,269,671 B2 | 9/2012 | Chen et al. |
| 2005/0167797 A1 | 8/2005 | Bong |
| 2006/0276157 A1 | 12/2006 | Chen et al. |
| 2007/0063056 A1 | 3/2007 | Gaucher et al. |
| 2010/0044826 A1 | 2/2010 | Farooq et al. |
| 2012/0188138 A1* | 7/2012 | Liu ..................... H01Q 1/2283 343/776 |
| 2012/0280860 A1* | 11/2012 | Kamgaing ........... H01Q 1/2283 342/368 |

OTHER PUBLICATIONS

H. Chuang et al., "A 60-GHz Millimeter-Wave CMOS Integrated On-Chip Antenna and Bandpass Filter," IEEE Transactions of Electron Devices, vol. 58, No. 7, Jul. 2011, pp. 1837-1845.

R.A. Alhalabi et al., "Design of High-Efficiency Millimeter-Wave Microstrip Antennas for Silicon FRIC Applications," Proceedings of the 2011 IEEE International Symposium on Antennas and Propagation, Jul. 2011, pp. 2055-2058.

K.K. O et al., "On-Chip Antennas in Silicon ICs and Their Application," IEEE Transactions on Electron Devices, vol. 52, No. 7, Jul. 2005, pp. 1312-1323.

List of IBM Patents or Patent Applications Treated as Related.

* cited by examiner

100

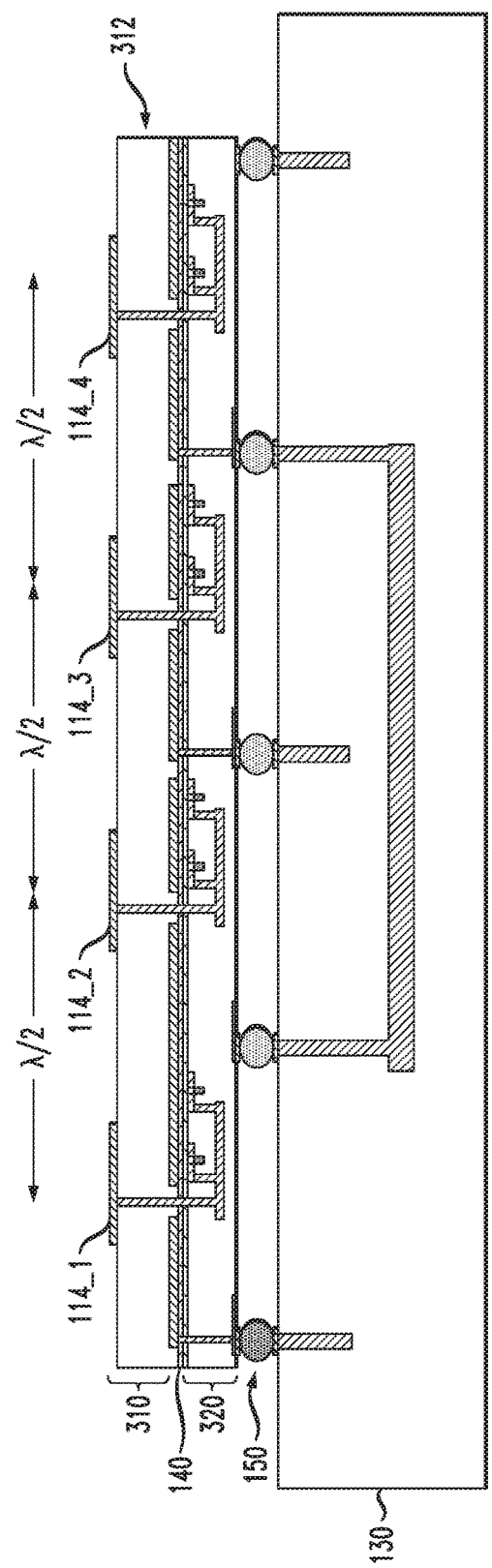

400

INTEGRATION OF AREA EFFICIENT ANTENNAS FOR PHASED ARRAY OR WAFER SCALE ARRAY ANTENNA APPLICATIONS

TECHNICAL FIELD

The field generally relates to antenna package structures and, in particular, to antenna package structures and techniques to implement large phased array antenna systems or 3D wafer scale antenna array systems for millimeter-wave and Terahertz (sub millimeter-wave) operating frequencies.

BACKGROUND

In general, RF (radio frequency) systems typically utilize some type of antenna structure for wireless communication. For frequencies up to 60 GHz, an antenna structure is designed separately from a radio frequency integrated circuit (RFIC) package, and then connected to the RFIC package. In particular, with this technique, an antenna structure, whether a single antenna or an antenna array, can be connected to the RFIC package using cables with connectors or using bonding wires.

For millimeter-wave frequencies in a range of 60 GHz to 94 GHz, an antenna can be implemented in an antenna-in-package that includes and RFIC die, and one or more antenna structures and associated antenna feed lines, wherein the antenna structure is attached to the RFIC die. This technique eliminates the need to use a bonding wire as the antenna feed line, thereby resulting in reduced power loss and reduced antenna impedance mismatch due to the extra inductance from the bonding wire. With this design, the antenna-in-package is an RFIC package, as the antenna-in-package includes not only the antenna structure, but also all the low frequency components, such as power plane, base band signal lines, control lines, DC power supply line, etc. The antenna-in-package is attached to an application board typically through BGA balls.

For operating frequencies above 94 GHz, however, it is not trivial to design and manufacture antenna-in-package structures due to the lack of availability of proper antenna substrates and the limitations of currently available processing technologies that do not afford the requisite manufacturing resolutions for such high-frequency applications. Furthermore, a standard interface between the antenna package and the RFIC die (typically a flip-chip connection) produces more than 1 dB signal attenuation at 94 GHz, minimizing the advantages of antenna-in-package designs.

SUMMARY

In general, embodiments of the invention include package structures for integrally packaging antennas with semiconductor RFIC chips to form compact integrated radio/wireless communications systems that operate in the millimeter-wave and terahertz frequency ranges. In one embodiment, a package structure includes an RF IC chip, and an antenna package bonded to the RFIC chip. The antenna package includes a glass substrate, at least one planar antenna element formed on a first surface of the glass substrate, a ground plane formed on a second surface of the glass substrate, opposite the first surface, and an antenna feed line formed through the glass substrate and connected to the at least one planar antenna element. The antenna package is bonded to a surface of the RFIC chip using a layer of adhesive material.

Other embodiments of invention will be described in the following detailed description of embodiments, which is to be read in conjunction with the accompanying drawings.

BRIEF DESCRIPTION OF THE DRAWINGS

FIG. 3A is a schematic side view of a wireless communications package structure according to yet another embodiment of the invention.

DETAILED DESCRIPTION

Embodiments of the invention will now be discussed in further detail with regard to structures and methods for integrally packaging antenna structures with semiconductor RFIC chips to form compact integrated radio/wireless communications systems that operate in the millimeter-wave and terahertz frequency ranges. The exemplary antenna package structures and techniques described herein are compatible with wafer-level 3D integration to enable the implementation of large phased array antenna systems or 3D wafer scale array antenna systems for millimeter-wave or terahertz operating frequencies.

It is to be understood that the various layers, structures, and regions shown in the accompanying drawings are not drawn to scale, and that one or more layers, structures, and regions of a type commonly used in integrated antenna and chip packages may not be explicitly shown in a given drawing. This does not imply that the layers, structures and regions not explicitly shown are omitted from the actual integrated chip packages. Moreover, the same or similar reference numbers used throughout the drawings are used to denote the same or similar features, elements, or structures, and thus, a detailed explanation of the same or similar features, elements, or structures will not be repeated for each of the drawings.

Figure 1:
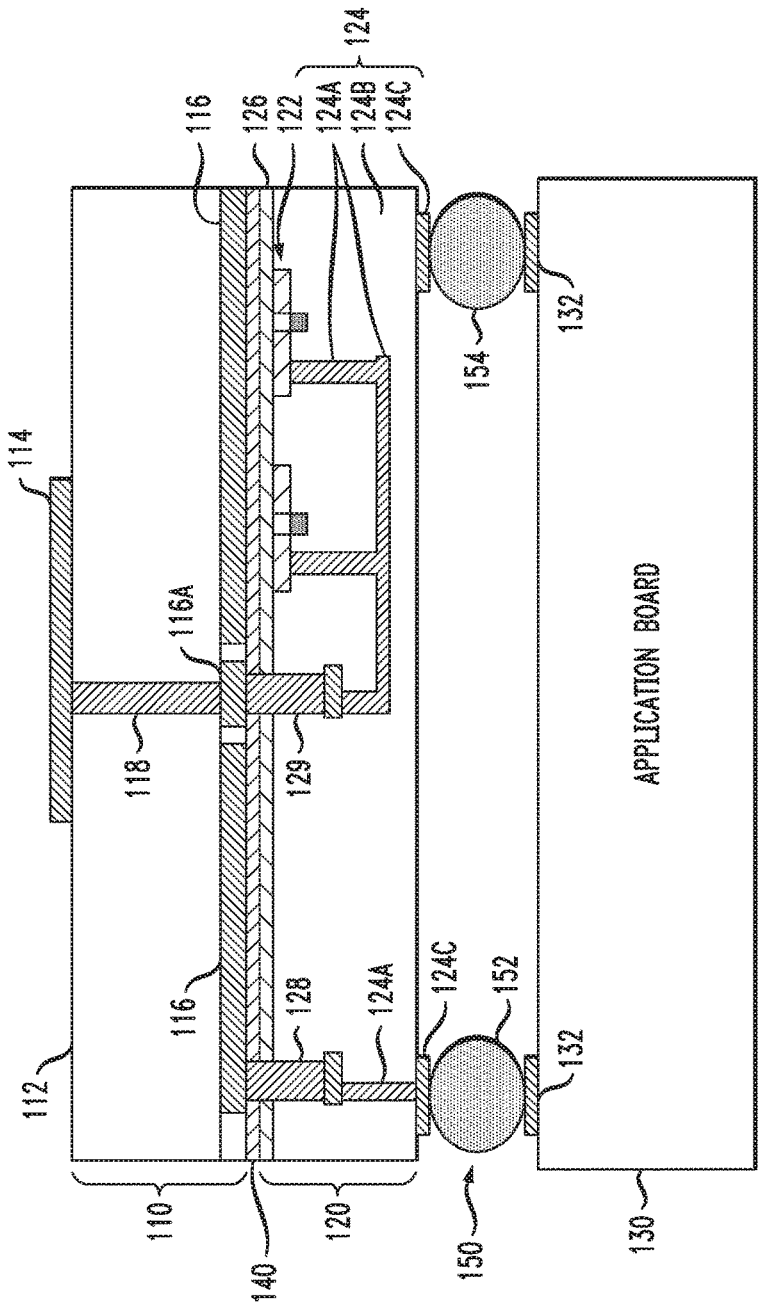
FIG. 1 is a schematic side view of a wireless communications package structure according to an embodiment of the invention.

FIG. 1 is a schematic side view of a wireless communications package structure according to an embodiment of the invention. In particular, FIG. 1 schematically illustrates a wireless communications device 100 comprising an antenna package 110, a RFIC chip 120, and an application board 130. The antenna package 110 comprises a glass substrate 112, a planar antenna 114 formed on one side of the glass substrate 112, and a ground plane 116 and contact pad 116A formed on an opposite side of the glass substrate 112. An antenna feed line 118 is formed through the glass substrate 112 providing an electrical connection between the contact pad 116A and a feed point of the planar antenna 114. The contact pad 116A is formed to be electrically isolated from the ground plane 116. The antenna package 110 is bonded to the RFIC chip 120 using a layer of adhesive material 140. In one embodiment, the layer of adhesive material 140 has a thickness in a range of about 1 µm to about 20 µm.

In general, the RFIC chip 120 comprises integrated circuitry 122, a BEOL (back end of line) structure 124, an insulating layer 126, and a plurality of metallic joint structures 128 and 129 (or micro vias). In one embodiment of the invention, the RFIC chip 120 is formed using a bulk SOI (silicon on insulator) substrate having a buried oxide (BOX) layer disposed between two layers of silicon wherein one layer of silicon (front side surface) comprises a thin silicon layer in which active devices are formed, and wherein the other layer of silicon (back side surface or substrate) is a relatively thick silicon layer that can be utilized for various purposes as is known in the art.

In the embodiment of FIG. 1, the integrated circuitry 122 comprises a plurality of active circuit devices and other electronic components that are formed in the front side (active surface) of the RFIC chip 120. In particular, for an SOI substrate embodiment, the integrated circuitry 122 is formed in the thin silicon layer on the front side of the SOI substrate. The integrated circuitry 120 includes active devices and other components that are configured to implement, e.g., a receiver, a transmitter, or a transceiver circuit, and other active or passive circuit elements that are commonly used to implement a wireless communications system, an imager, or millimeter-wave/terahertz sensors.

Furthermore, for an SOI substrate embodiment, the insulating layer 126 in FIG. 1 corresponds to the BOX layer of the SOI substrate. The insulating layer 126 may be formed of a silicon oxide material, such as $SiO_2$ (dielectric constant of 3.9) or other types of insulating or dielectric materials that are suitable for the given application. In one embodiment, the insulating layer 126 is formed of $SiO_2$ with a thickness of about 10 nm to about 4 μm. In the illustrative embodiment of FIG. 1, it is assumed that the backside silicon layer of the SOI substrate is completely removed (via a grinding process and/or an etching/thinning process) before bonding the antenna package 110 to the backside of the RFIC chip 120 via the layer of adhesive material 140.

The BEOL structure 124 is formed on the front side of the RFIC chip 120 to provide electrical connections between components of the integrated circuitry 122. In general, the BEOL structure 124 comprises multiple layers of metallization patterns 124A and insulating (dielectric) material 124B, as well as a plurality of bonding pads 124C. In one embodiment, the BEOL structure 124 has a total thickness of about 5 μm to about 20 μm. The BEOL structure 124 can be built using well known semiconductor processing technologies and materials that are suitable for the given application.

The metallization patterns 124A comprise inter-level contact pads, interconnect wires, and vias, which are used to form electrical connections between components of the integrated circuitry 122. The insulating material 124B may be formed of layers of silicon oxide material, or other suitable dielectric materials with a dielectric constant in a range of about 2 to about 3.9, for example. The metallic joint structures 128 and 129 are metallic elements (micro via elements) that are formed (separate from, and subsequent to, the BEOL processing) to provide electrical connections between components of the antenna package 110 and metallization patterns 124A of the BEOL structure 124.

Furthermore, the bonding pads 124C of the BEOL structure 124 include, for example, ground pads, DC power supply pads, I/O (input/output) signal pads, control signal pads, etc. The application board 130 comprises a plurality of bonding pads 132 that are formed in alignment with corresponding ones of the bonding pads 124C of the RFIC chip 120. In the embodiment of FIG. 1, the RFIC chip 120 is flip-chip mounted to the application board 130 using an array 150 of controlled collapse chip connections (C4), or other known techniques. It is to be understood that some of the C4 connections may be non-electrical connections that merely serve to physically bond the RFIC chip 120 to the application board 130, while other C4 connections may serve as bonding connections, as well as electrical interface connections between the application board 130 and the RFIC chip 120.

For instance, in the embodiment of FIG. 1, a C4 connection 152 is utilized in conjunction with the metallic joint 128, a portion of the BEOL metallization pattern, and the contact pads 124A and 124C, to form a ground connection between the ground plane 116 of the antenna package 110 and a ground contact 132 on the application board 130. On the other hand, a C4 connection 154 (and others) may simply be used to flip-chip bond the RFIC chip 120 to the application board 130, such that no wiring is connected to the associated bonding pads 124C and 132 and, thus, the C4 connection does not serve as an electrical connection. Moreover, other C4 connections 150 (not specifically shown in FIG. 1) provide supply voltage connections, I/O connections, control signal connections, etc., between the RFIC chip 120 and associated contact pads 132 on the application board 130.

In other embodiments of the invention, the RFIC chip 120 can be electrically connected to the application board 130 using wire bonds, as is readily understood by one of ordinary skill in the art. For example, in one embodiment, the RFIC chip 120 can be designed with a larger footprint (e.g., larger width) than the footprint of the antenna package 110, such that the contact pads 124C of the BEOL structure 124 could be formed on the peripheral/perimeter region of the backside surface of the RFIC chip 120, which is not covered by the antenna package 110. In this embodiment, the front side of the RFIC chip 120 could be bonded to the application board 130 using an adhesive material or some other standard bonding techniques, and wire bonds would be formed to make electrical connections between the bonding pads 132 on the application board and the bonding pads 124C that are exposed on the perimeter region of the backside surface of the RFIC chip 120. In other embodiments, an electrical interface can be implemented using a combination of C4 connections and wire bonds, as is readily understood by one of ordinary skill in the art.

As is readily understood by one of ordinary skill in the art, the application board 130 can be formed of one or more substrates comprising one or more levels of metallization patterns and via structures to route the I/O signals, control signals, and power supply signals to and from the RFIC chip 120 as needed. The application board 130 can be formed of standard FR4 material with copper metallization, or other suitable materials commonly used to construct a standard PCB (printed circuit board), for example.

In the embodiment of FIG. 1, the antenna package 110 is a structure that can be separately fabricated and then bonded to the RFIC chip 120. The antenna package 110 can be fabricated from a metallized glass substrate, wherein the planar antenna 114 and ground plane 116 and contact pad 116A are formed by patterning metal layers on opposing side of the glass substrate 112. The metallic patterns can be formed of copper or gold, or other types of metallic material suitable for the given application. The glass substrate 112 can be formed of a glass material that is suitable for the given application. In one embodiment, the glass substrate 112 is formed of a glass material having a dielectric constant ε of about 4.0. The antenna feed line 118 can be a TGV (through-glass-via) that is formed by etching or drilling a hole through the glass substrate 112, and then filling the through hole, or electroplating the walls of the through hole, with a metallic material such as copper.

The planar antenna 114 can be implemented using any suitable planar antenna structure that provides broadside radiation R as shown in FIG. 1. In one embodiment of the invention, the planar antenna 114 comprises a planar patch radiating element having a resonant length in a range from about one-quarter wavelength to about one-half wavelength. The contact point of the antenna feed line 118 to the planar antenna 114 is selected so that the antenna impedance is matched to 50 Ohms, which is standard for most RF transceivers.

Depending on the type of planar antenna used, the ground plane 116 operates as an antenna ground plane (e.g., for microstrip-type antenna structures) as well as a reflector element to reflect radiation away from the RFIC chip 120. In other embodiments in which the planar antenna 114 can operate as a radiating element without the need for an antenna ground plane, the ground plane 116 serves to reflect radiation away from the RFIC chip 120.

The operating frequency and other performance characteristics of the antenna package 110 will vary based on, e.g., the dimensions of the planar antenna 114 and the glass substrate 112, and the dielectric constant of the glass material used to form the glass substrate 112. For example, for a planar patch antenna, a length of the patch antenna will determine an operating frequency and other performance characteristics of the antenna. Typically, the length of a planar patch antenna is in a range of about ¼-wavelength to about ½-wavelength. For a phased array antenna application (e.g., FIG. 2) with multiple patch antennas for example, the distance (pitch) between each patch antenna in the phased array is equal to about λ/2.

Moreover, the distance between the planar antenna 114 and the ground plane 116 (i.e., the thickness of the glass substrate 112) can be varied to trade-off antenna bandwidth and efficiency. The antenna bandwidth can be improved by increasing the distance between the planar patch antenna 114 and ground plane 116, at the cost of decreased antenna efficiency. In one embodiment, the glass substrate 112 can have a thickness in a range from about 50 µm to about 750 µm, which provides a 12% target bandwidth an over an operating frequency range from about 10 GHz to about 150 GHz.

With regard to the antenna feed line 118, the minimum width of the TGV is limited by the aspect ratio that can be achieved with the etching or drilling process used to form a through hole in the glass substrate 112. Typically an aspect ratio of 2 or 10 to 1 can be achieved. Therefore, for a glass substrate with a thickness of 50 µm, a minimum width of 25 µm to 5 µm can be achieved.

With regard to the thickness of the metallization, the metal thickness can be derived by computing the skin depth given by:

$$\delta = \sqrt{\frac{2\rho}{2\pi f \mu}},$$

where ρ is the metal conductivity and µ is the permittivity. For copper at 60 GHz, the skin depth is 0.27 µm. To minimize ohmic losses, the metallization should have a thickness of at least 5 skin depths. Therefore, for a 60 GHz operating frequency, the thickness of the copper metallization should be at least 1.35 µm.

In one embodiment of the invention, the wireless communications device 100 of FIG. 1 is fabricated as follows. As noted above, the antenna package 110 and RFIC chip 120 are fabricated separately, and then bonded together using adhesive material. The RFIC chip 120 is fabricated using standard CMOS or other semiconductor processing technologies. For example, starting with an SOI substrate, FEOL (front end of line) processing techniques are utilized to form the integrated circuitry 122 on the front side silicon layer of the SOI substrate, followed by BEOL processing techniques to form the BEOL structure 124.

The SOI substrate is then bonded face down to a handler substrate (e.g., glass carrier) using a polyimide adhesive, for example. Then, a backside etching or grinding process is performed to remove the backside bulk silicon layer from the SOI substrate. With this process, the bulk silicon layer is completely removed down to the BOX layer (e.g., the insulating layer 126 in FIG. 1). Following the backside etch, a process is performed to form the metallic joints 128 and 129 with the etched SOI substrate still attached to the handler substrate.

In particular, in one embodiment of the invention, the metallic joints 128 and 129 are formed as follows. Initially, a layer of photoresist material is deposited on the BOX layer and patterned to form openings in the photoresist in regions of the backside surface where via holes are to be etched and subsequently filled with metallic material (e.g., copper) to form the metallic joints 128, 129. The patterned photoresist layer is then used as a mask to perform an anisotropic etch process to etch the BOX layer (insulating layer 126) and the BEOL insulating material 124B down to contact pads that are formed as part of the BEOL metallization 124A.

Following the etch process, the photoresist pattern is removed using standard techniques, and a thin conformal seed layer is deposited to line the etched via holes. The thin conformal seed layer can be a thin copper layer. Following deposition of the seed layer, a photoresist material is deposited and patterned to form a second photoresist pattern that exposes the via holes lined with the seed layer. A copper fill process is then performed to fill the exposed via holes with copper material using the seed layer as a nucleating layer for the deposition process. In one embodiment, the copper fill process can be implemented using an electroplating process wherein the seed layer serves as an anode/cathode for the electroplating process. With this process, the second photoresist pattern covers the backside region of the SOT substrate so that copper is only deposited in the via holes exposed by the second photoresist pattern.

Following the copper fill process, the second photoresist pattern is removed, resulting in the completed RFIC chip 120 with exposed portions of the metallic joints 128 and 129 on the backside of the RFIC chip 120. As this stage of fabrication, the front side of the RFIC chip 120 remains attached to the handler substrate. Then, the separately formed antenna package 110 is bonded to the etched backside of the RFIC chip 120, wherein copper bonding process is performed to bond the exposed surfaces of the metallic joints 128, 129 to desired contact points of the metallization (e.g., ground plane 116, contact pad 116A, FIG. 1) on the bottom surface of the glass substrate 112.

Furthermore, as part of this bonding step, a layer of adhesive material (e.g., adhesive layer 140, FIG. 1) is formed on the bottom surface of the glass substrate 112, which further serves to bond the antenna package 110 to the backside of the RFIC chip 120. In one embodiment, the layer of adhesive material includes a polyimide layer with a thickness of 2-3 µm, for example.

After the antenna package 110 is bonded to the backside of the RFIC chip 120, the handler substrate is removed from the front side of the RFIC chip 120 using a standard release process. For example, a laser release process can be performed by irradiating the adhesive layer (which bonds the handler substrate to the RFIC chip 120) through the handler (glass) substrate, to thereby laser ablate the adhesive layer and release the handler substrate from the front side of the RFIC chip 120. A cleaning process is then performed to remove any remaining residue from the front side of the RFIC chip 120. Thereafter, the RFIC chip 120 (with the antenna package 110 mounted on the backside thereof) is bonded to the application board 130 using, e.g., C4 connections, as discussed above. Again, in other embodiments as discussed above, wire bond connections can be utilized (either alone or in combination with C4 connections) to provide electrical connections between the RFIC chip 120 and the application board 130.

The embodiment of FIG. 1 illustrates an antenna package 110 with a single glass substrate 112 and one antenna structure for an SOI implementation. In other embodiments of the invention, antenna structures that utilize multiple stacked glass substrates can be implemented as well. For example, such antenna structures include stacked patch antennas, L-probe fed patch antennas, grid antennas, dipole antennas, etc. By way of specific example, in a stacked patch antenna implementation, an antenna package comprises a first glass substrate and a second glass substrate bonded together to form stacked structure, wherein the first glass substrate comprises a first patch radiator element, and wherein the second glass substrate comprises a second patch radiator element. The second patch radiator element can be fed by an antenna feed line (such as shown in FIG. 1), whereas the first patch radiator element (disposed over the second patch radiator element) can be capacitively feed by the second patch radiator element.

Figure 2:
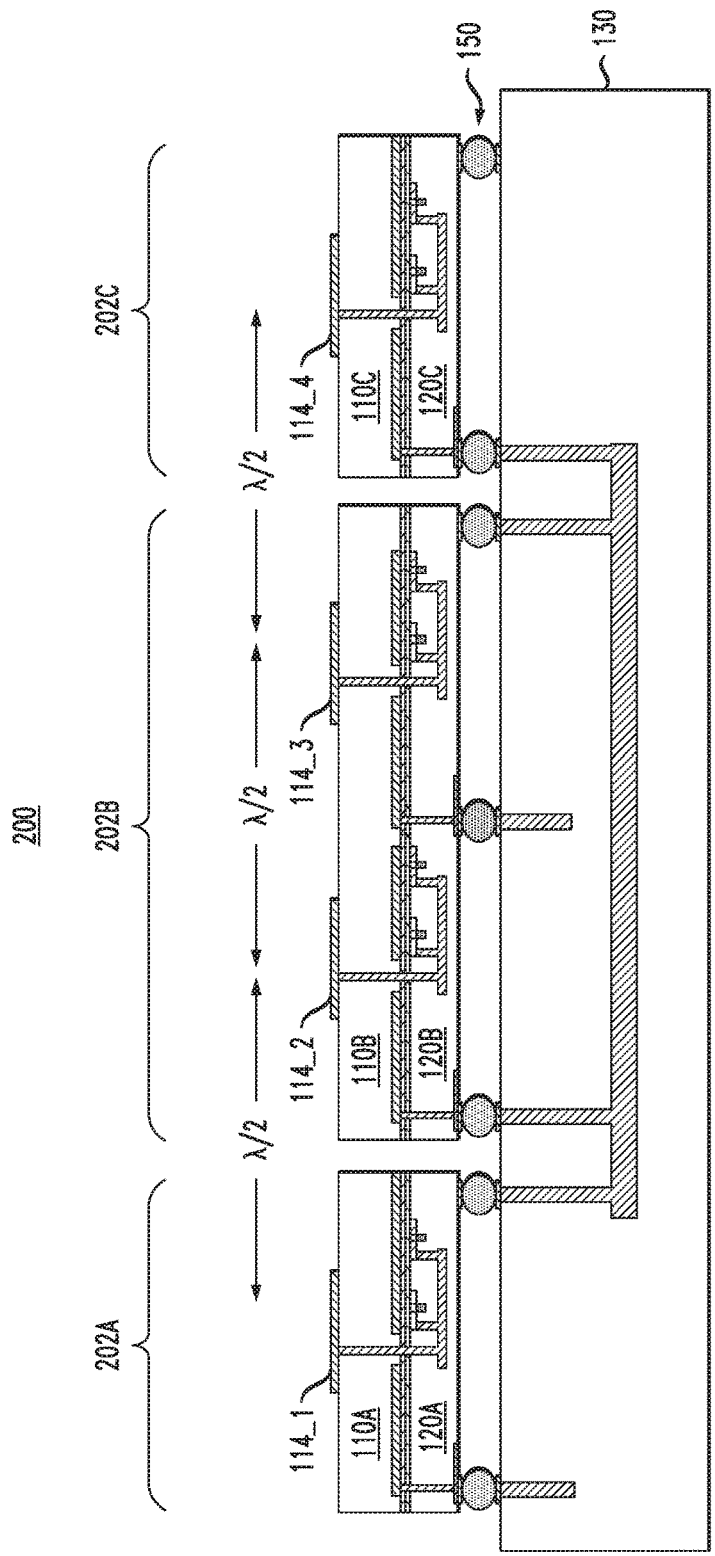
FIG. 2 is a schematic side view of a wireless communications package structure according to another embodiment of the invention.

Moreover, in other embodiments of the invention, an antenna package can be fabricated with multiple antenna radiating elements to provide a phased array antenna system. For example, FIG. 2 is a schematic side view of a wireless communications package structure according to another embodiment of the invention, which provides a phased-array antenna structure for an SOI implementation. In particular, FIG. 2 schematically illustrates a wireless communications device 200 comprising multiple package structures 202A, 202B, and 202C bonded to an application board 130 using an array of C4 connections 150.

In the embodiment of FIG. 2, each package structure 202A, 202B, and 202C comprises a respective antenna package 110A, 110B, and 110C, bonded to a backside of a respective RFIC chip 120A, 120B and 120C. Each package structure 202A, 202B, and 202C is conceptually similar in design to the package structure (antenna package 110 and RFIC chip 120) discussed above with reference to FIG. 1. However, in the embodiment of FIG. 2, each package structure 202A, 202B, and 202C is a separate package that is bonded to the application board 130 so as to maintain antenna elements 114-1, 114-2, 114-3 and 114-4 at half-wavelength spacing. The embodiment of FIG. 2 is useful for a large antenna array SOI implementation by allowing the tiling of separate chips with half wavelength spacing. While some package structures (e.g., 202A and 202C) are formed with one antenna element (e.g., 114-1 and 114-4), other package structures (e.g., 202B) are formed with multiple antenna elements (e.g., 114-2 and 114-3). Each package structure 202A, 202B and 202C can be fabricated using the techniques discussed above with reference to the exemplary embodiment of FIG. 1.

Figure 3B:
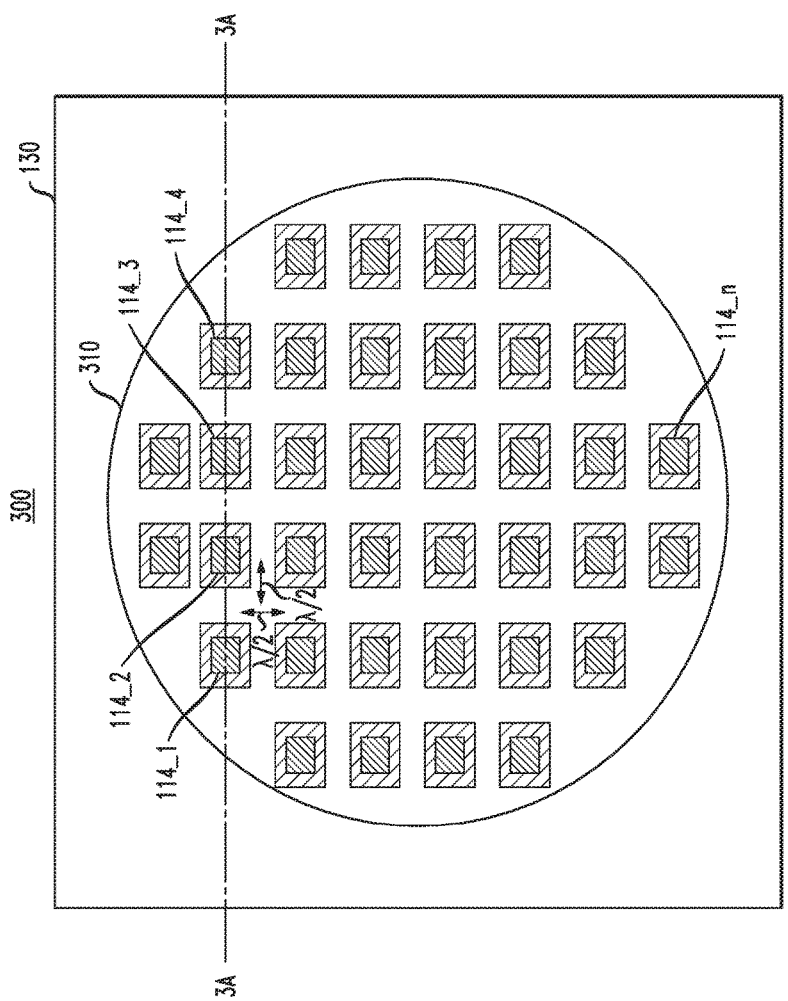
FIG. 3B is a schematic top view of the wireless communications package structure of FIG. 3A, according to an embodiment of the invention.

FIGS. 3A and 3B schematically illustrate a communications package structure according to yet another embodiment of the invention. In particular, FIG. 3B is a schematic top view of a wireless communications device 300, while FIG. 3A is a schematic side view of the wireless communications device 300 taken along line 3A-3A in FIG. 3B. The embodiment of the wireless communications device 300 in FIGS. 3A/3B is similar to the embodiment of the wireless communications device 200 of FIG. 2, except that the embodiment of FIGS. 3A/3B provides a 3D SOI wafer scale implementation, at millimeter-wave frequencies, for a very large phased-array antenna application.

In particular, as shown in FIGS. 3A/3B, an antenna package 310 comprises an array of planar antennas (e.g., antennas 114-1, 114-2, 114-3, 114-4 . . . , 114-n) that are formed on one side of a single glass wafer 312. The wafer scale antenna package 310 is bonded to a backside surface of an SOI wafer 320 comprising active RFIC integrated circuitry and BEOL structures, as needed, to operate the array of antennas 114-1, 114-2, 114-3, 114-4 . . . , 114-n as a phased-array antenna system, using techniques known to those of ordinary skill in the art.

Figure 4:
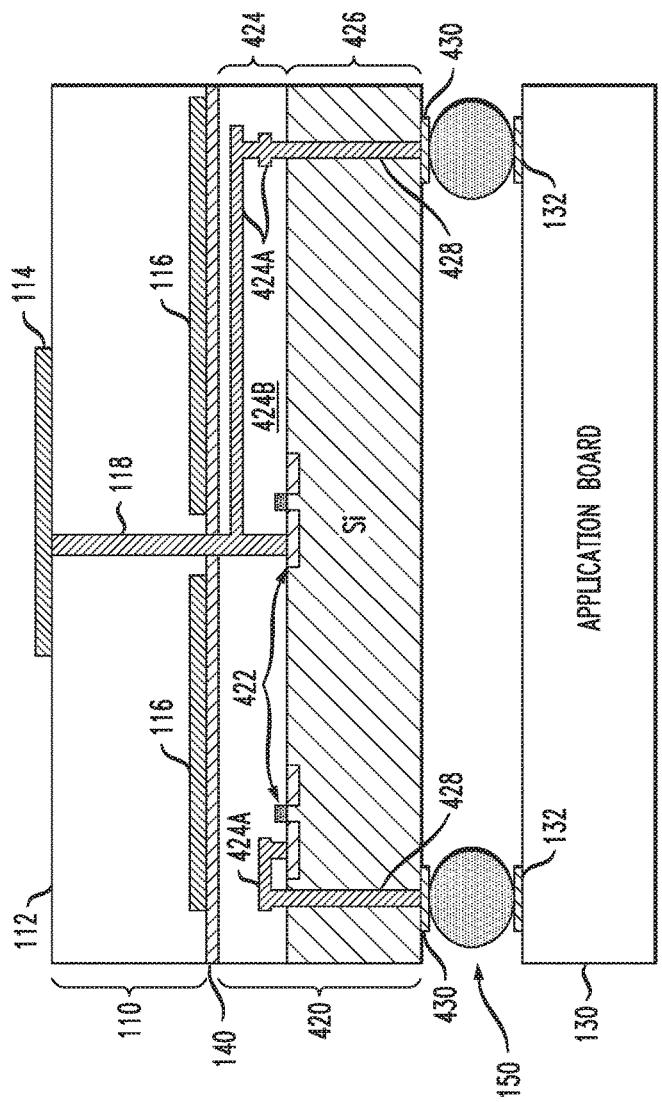
FIG. 4 is a schematic side view of a wireless communications package structure according to another embodiment of the invention.

FIG. 4 is a schematic side view of a wireless communications package structure according to another embodiment of the invention. In particular, FIG. 4 schematically illustrates a wireless communications device 400 which is similar to the wireless communications device 100 of FIG. 1, except that in the exemplary embodiment of FIG. 4, the antenna package 110 is bonded to a front side surface of an RFIC chip 420.

In particular, as shown in FIG. 4, the RFIC chip 420 comprises integrated circuitry 422, a BEOL structure 424, and a bulk silicon layer 426. Although not specifically shown, in an SOI embodiment, the silicon substrate 426 may comprise a BOX layer, wherein the integrated circuitry 422 is formed in a thin layer of silicon on top of the BOX layer. The BEOL structure 424, which is formed on the front side of the RFIC chip 420, comprises multiple layers of metallization patterns 424A embedded in insulating (dielectric) material 424B, to provide electrical connections between components of the integrated circuitry 422.

In the embodiment of FIG. 4, the antenna package 110 is bonded to the front side of the RFIC chip 420 using the adhesive layer 140, whereas the backside of the RFIC chip 420 is bonded to the application board 130 using an array of C4 connections 150. As further depicted in FIG. 4, the bulk silicon layer 426 comprises a plurality of TSVs (through-silicon-vias) 428 to provide electrical connections between certain points of the metallization pattern 424A and bonding pads 430 formed on bottom surface of the bulk silicon layer 426 (i.e., on the backside of the RFIC chip 420). The through-silicon-vias 428 can be fabricated using well known techniques. In other embodiments of the invention, wire bonds can be utilized either alone, or in combination with C4 connections, to provide electrical connections between the RFIC chip 420 and the application board 130.

In another embodiment of the invention, similar to the embodiments discussed above with reference to FIGS. 2 and 3A/3B, a large phased array antenna system or wafer scale antenna array can be designed based on the package structure of FIG. 4. In such embodiments, the RFIC chips 120A, 120B and 120C (FIG. 2) and RFIC chip 320 (FIGS. 3A/3B) would be replaced with an RFIC chip having a structure similar to that depicted in FIG. 4, wherein multiple RFIC chips or an RFIC wafer would be backside mounted to the application board 130, with antenna packages or an antenna wafer bonded to the front side of the RFIC chip(s).

Those of ordinary skill in the art will readily appreciate the various advantages associated with integrated chip/antenna package structures according to embodiments of the invention. For instance, the use of the low-loss glass substrates to form antenna package structures enables the realization of high-efficient antenna designs that are compatible for use with high-resistivity bulk, SOI, or SOG (silicon on glass) Si technologies, while using standard bonding techniques to form the package structures. These standard processing techniques enable antennas to be integrally packaged with IC chips such as transceiver chips, thereby providing compact designs with very low loss between the transceiver and the antenna. The use of semiconductor fabrication technologies (as compared to PCB technology) allow the design of higher-precision metallization geometries compatible with millimeter wave and terahertz operating frequencies.

Moreover, various types of antenna designs can be implemented as discussed above for single antenna or phased-array antenna applications. The embodiments discussed herein are compatible with wafer scale level fabrication and integration, thereby enabling ease of manufacture of large phase array antenna structures. Moreover, multiple wafer level integration can be tiled (e.g., FIG. 2) to readily increase a number of antenna for use in phase-array antenna applications using a multitude of different chips integrated on a given carrier or application board to implement a phase-array antenna.

It is to be further understood that the antenna package structures illustrated herein can extended or varied depending on the application, e.g., antenna structure. 110 routing requirements, power and ground plane requirements, etc. Those of ordinary skill in the art readily understand that the antenna performance parameters such as antenna radiation efficiency and bandwidth and operating resonant frequency will vary depending on the dielectric constant, loss tangent, and thickness of the dielectric/insulating materials that form the substrate layers. Moreover, the size and structure of the various radiating elements of the antennas shown in drawings will determine the resonant frequency of the antenna, as is well understood to those of ordinary skill in the art.

Although embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

We claim:

1. A package structure, comprising:
an antenna package, comprising:
a glass wafer comprising a first surface and a second surface, opposite the first surface;
a plurality of planar antenna elements patterned on the first surface of the glass wafer forming an array of antenna radiating elements;
a ground plane formed on the second surface of the glass wafer; and
a plurality of antenna feed lines formed through the glass wafer from the first surface to the second surface, wherein the antenna feed lines are connected to corresponding ones of the planar antenna elements patterned on the first surface of the glass wafer;
a semiconductor wafer bonded to the second surface of the glass wafer, the semiconductor wafer comprising a plurality of RFIC (radio frequency integrated circuit) chips;
an electrical interface comprising electrical connections to connect the RFIC chips to the antenna feed lines of the planar antenna elements, wherein the electrical interface comprises micro via joints, wherein the micro via joints are integrally formed within a BEOL (back end of line) structure of each of the RFIC chips, and wherein the micro via joints provide electrical connections between wiring of the BEOL structure and metallization on the second surface of the glass substrate; and
wherein the semiconductor wafer is bonded to the ground plane on the second surface of the glass substrate of the antenna package using a layer of adhesive material.

2. The package structure of claim 1, wherein the glass wafer comprises a glass material having a dielectric constant of about 4.0.

3. The package structure of claim 1, wherein the layer of adhesive material comprises a polyimide layer.

4. The package structure of claim 1, wherein the semiconductor wafer comprises a silicon-on insulator (SOI) substrate, wherein the SOI substrate comprises a silicon layer in which active devices are formed, and a buried insulating layer, wherein a backside surface of the semiconductor wafer is etched to expose the buried insulating layer, and wherein the buried insulating layer is bonded to the ground plane on the second surface of the glass wafer of the antenna package using the layer of adhesive material.

5. The package structure of claim 1, wherein the second surface of the antenna package is bonded to a front side surface of the semiconductor wafer.

6. The package structure of claim 5, wherein the electrical interface comprises BEOL wiring of the RFIC chips of the semiconductor wafer.

7. The package structure of claim 5, wherein the front side surface of the semiconductor wafer is bonded to the ground plane on the second surface of the glass wafer of the antenna package using the layer of adhesive material.

8. The package structure of claim 1, further comprising an application board, wherein the semiconductor wafer is mounted to the application board.

9. The package structure of claim 8, wherein the semiconductor wafer is mounted to the application board using an array of C4 solder ball connections.

10. The package structure of claim 9, wherein the C4 solder ball connections are coupled to through-silicon vias that are formed in a backside of the semiconductor wafer.

11. The package structure of claim 1, wherein package structure comprises a wireless communications device that is configured to operate at a millimeter wave frequency range or higher.

12. The package structure of claim 1, wherein the layer of adhesive material has a thickness in a range of about 1 μm to about 20 μm.

13. A wireless communications device, comprising:
an antenna package, comprising:
a glass wafer having a first surface and a second surface, opposite the first surface;
a plurality of planar antenna elements patterned on the first surface of the glass wafer forming an array of antenna radiating elements;
a ground plane formed on the second surface of the glass wafer; and a plurality of antenna feed lines formed through the glass wafer from the first surface to the second surface, wherein the antenna feed lines are connected to corresponding ones of the planar antenna elements patterned on the first surface of the glass wafer;

a semiconductor wafer electrically and mechanically coupled to the antenna package;

wherein the semiconductor wafer comprises transceiver circuitry connected to the plurality of planar antenna elements;

wherein the transceiver circuitry is configured to operate the plurality of planar antenna elements as a phased array antenna system;

an electrical interface comprising electrical connections to connect the transceiver circuitry to the antenna feed lines of the planar antenna elements, wherein the electrical interface comprises micro via joints, wherein the micro via joints are integrally formed within a BEOL (back end of line) structure of the semiconductor wafer, and wherein the micro via joints provide electrical connections between wiring of the BEOL structure and metallization on the second surface of the glass substrate; and wherein the semiconductor wafer is bonded to the ground plane on the second surface of the glass substrate of the antenna package using a layer of adhesive material.

14. The wireless communications device of claim 13, wherein the glass wafer comprises a glass material having a dielectric constant of about 4.0.

15. The wireless communications device of claim 13, wherein the wireless communications device is configured to operate the phased array antenna system at a millimeter wave frequency range or higher.

16. The wireless communications device of claim 13, wherein the layer of adhesive material comprises a polyimide layer.

17. The wireless communications device of claim 13, wherein the semiconductor wafer comprise a silicon-on insulator (SOI) substrate, wherein the SOI substrate comprises a silicon layer in which the transceiver circuitry is formed, and a buried insulating layer, wherein a backside surface of the semiconductor water is etched to expose the buried insulating layer, and wherein the buried insulating layer is bonded to the ground plane on the second surface of the glass wafer of the antenna package using the layer of adhesive material.

18. The wireless communications device of claim 13, wherein the second surface of the antenna package is bonded to a front side surface of the semiconductor wafer using the layer of adhesive material.

19. The wireless communications device of claim 13, wherein the electrical interface comprises BEOL wiring of the semiconductor wafer.

20. The wireless communications device of claim 13, wherein the layer of adhesive material has a thickness in a range of about 1 μm to about 20 μm.

* * * * *